(12) United States Patent
Caruso et al.

(10) Patent No.: US 8,237,161 B2
(45) Date of Patent: Aug. 7, 2012

(54) AMORPHOUS BORON CARBIDE FILMS FOR P-N JUNCTIONS AND METHOD FOR FABRICATING SAME

(75) Inventors: Anthony N. Caruso, Overland Park, KS (US); Joseph A. Sandstrom, Moorhead, MN (US); David A. Bunzow, Fremont, CA (US)

(73) Assignee: North Dakota State University Research Foundation, Fargo, ND (US)

( * ) Notice: Subject to any disclaimer, the term of this patent is extended or adjusted under 35 U.S.C. 154(b) by 81 days.

(21) Appl. No.: 12/853,857

(22) Filed: Aug. 10, 2010

(65) Prior Publication Data

US 2012/0037904 A1 Feb. 16, 2012

(51) Int. Cl.
*H01L 29/04* (2006.01)
(52) U.S. Cl. ............. 257/52; 257/53; 257/55; 257/200; 257/E33.004

(58) Field of Classification Search ............... 257/52, 257/53, 55, 200
See application file for complete search history.

(56) References Cited

U.S. PATENT DOCUMENTS

| | | | |
|---|---|---|---|
| 6,600,177 B2 * | 7/2003 | Dowben ..................... 257/183 |
| 6,774,013 B2 * | 8/2004 | Dowben et al. ............. 438/478 |
| 2004/0178337 A1 * | 9/2004 | Kurkoski et al. .......... 250/269.4 |

* cited by examiner

*Primary Examiner* — Wai Sing Louie
(74) *Attorney, Agent, or Firm* — Volpe and Koenig, P.C.

(57) ABSTRACT

Amorphous semiconductor films with enhanced charged carrier transport are disclosed. Also disclosed is a method for fabricating and treating the film to produce the enhanced transport. Also disclosed are semiconductor p-n junctions fabricated with the films which demonstrate the enhanced transport. The films are amorphous and include boron, carbon, and hydrogen.

8 Claims, 6 Drawing Sheets

AMORPHOUS BORON CARBIDE FILMS FOR P-N JUNCTIONS AND METHOD FOR FABRICATING SAME

STATEMENT REGARDING FEDERALLY SPONSORED RESEARCH OR DEVELOPMENT

This invention was made with government support under Grant No. HR0011-06-C-0143 awarded by the Defense Advanced Research Projects Agency. The Government has certain rights in this invention.

FIELD OF INVENTION

This application is directed to semiconductor materials, methods for making the materials, and devices fabricated from the materials.

BACKGROUND

It has been found that thin films formed from the plasma enhanced chemical vapor deposition (PECVD) of orthocarborane yield a high resistivity amorphous semiconducting solid which includes boron, carbon and hydrogen. Such films, however, suffer from low mobility of charge carriers and readily delaminate from substrates due to humidity and high internal stresses.

Films having a better electrical carrier transport and reduced mechanical stress would enhance the performance of devices fabricated from them. Such devices include photovoltaic cells, radiovoltaic batteries (also referred to as nuclear or nuclearvoltaic batteries), neutron detectors, thermoelectric generators, and radiation-hard electronic devices. Photovoltaic and radiovoltaic cells may be collectively referred to as voltaic cells, since they may internally generate electrical current (electrical power) in a similar manner when exposed to both photons and charged particles from radioactive sources.

SUMMARY

Amorphous semiconductor films with enhanced electrical carrier transport and reduced likelihood of delamination from a substrate are disclosed. Also disclosed is a method for substrate pretreatment, film deposition onto the substrate, and post-treatment of the substrate-film heterostructure to produce the enhanced charged-carrier transport of the bulk film and at its interface with the substrate. Semiconductor p-n junctions fabricated with the films and substrates demonstrate the enhanced electrical carrier transport. The films are amorphous and include boron, carbon, and hydrogen.

DETAILED DESCRIPTION

Figure 1:
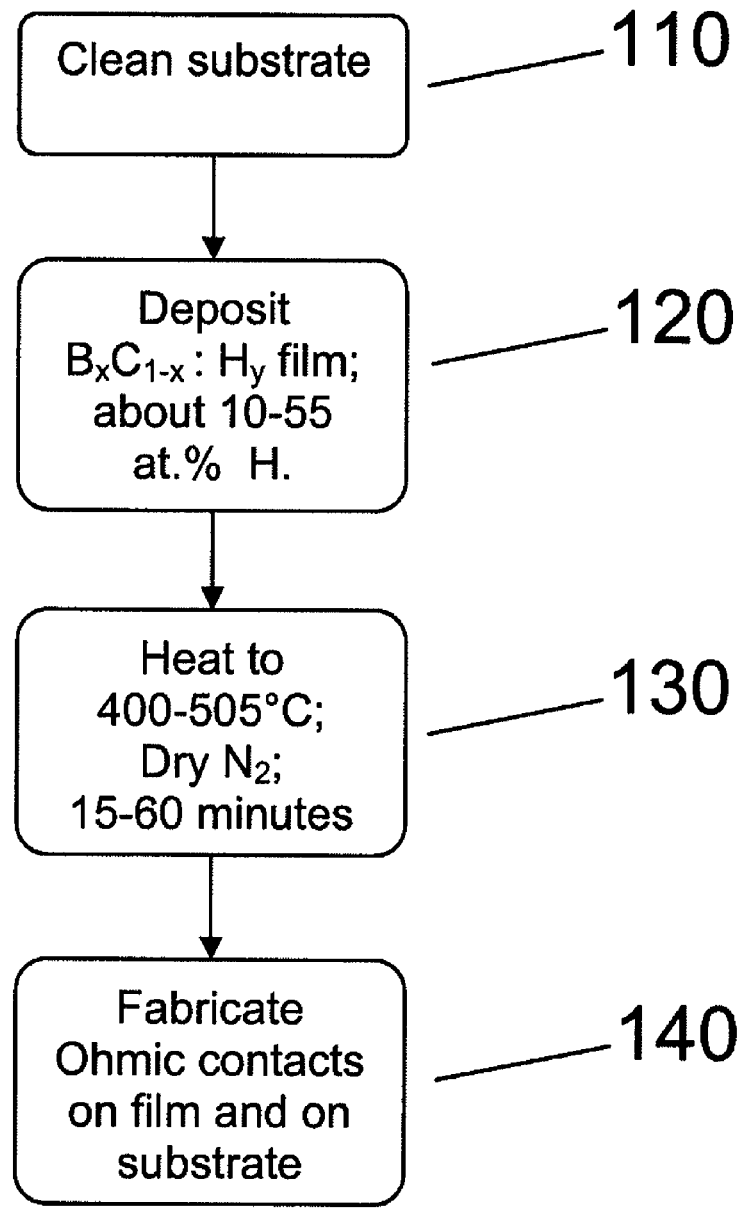
FIG. 1 is a flow diagram showing an embodiment of a process for depositing and heat-treating a semiconductor film.

FIG. 1 shows an overview of an embodiment of a fabrication process for a p-n junction comprising an amorphous boron carbide film. The amorphous boron carbide film may be deposited on a substrate. The substrate is put through a cleaning procedure 110. The cleaning procedure 110 will be explained in greater detail hereinafter with reference to FIG. 2. As disclosed below, the cleaning procedure 110 helps to enhance prevention of delamination of the film from the substrate.

Following cleaning procedure 110, an amorphous boron carbide film is deposited on the substrate, step 120. If the substrate and the amorphous boron carbide film are of opposite charged carrier type, a p-n junction may form at the interface between the substrate and the amorphous boron carbide film. The substrate could be n-type and the amorphous boron carbide film could be p-type, or vice-versa. Suitable substrate materials include, but are not limited to, single crystal silicon (Si) in both <100> and <111> crystallographic orientations and silicon carbide (SiC). Metals such as gold, copper, aluminum, nickel, platinum, tungsten or chromium may be utilized either as bulk substrates or vacuum deposited thin film layers on bulk substrates, alone or in combination with other thin film metal layers, to form ohmic or non-ohmic metal-semiconductor interfaces. In addition, amorphous boron carbide thin films may also be deposited on dielectric films such as silicon dioxide, silicon nitride, borosilicate glass and quartz.

The amorphous boron carbide film has an approximate atomic composition described by the formula $B_xC_{1-x}:H_y$, where x is in a range from about 0.7 to about 0.9 and y is in a range from about 0.1 to about 0.55. In other words, atomic hydrogen concentration may vary between about 10% and about 55%. The atomic percent of hydrogen may be adjusted in etch deposition by varying, for example, the flow rate of preheated argon through an orthocarborane bubbler from 1 to 45 standard cubic centimeters per minute (sccm). The fraction of atomic hydrogen in the amorphous boron carbide film may be measured using nuclear reaction analysis or Fourier transform infrared spectroscopy using methods known to those of ordinary skill in the art.

In one embodiment, the amorphous boron carbide film is deposited using plasma enhanced chemical vapor deposition (PECVD) with sublimed orthocarborane, 1,2 dicarbadodecaborane or $C_2B_{10}H_{12}$ as the sole precursor species. A vapor from sublimed solid orthocarborane is conveyed into a PECVD reaction chamber by a carrier gas such as Argon. In one example embodiment, not intended to be limiting, PECVD parameters may be a total pressure of 100 to 300 milliTorr (mT), RF power 50 Watts (W), and carrier flow (bubbler flow) 18 sccm.

The film may also be deposited using other methods including, but not limited to, reactive magnetron sputtering using either radio frequency (RF) or DC, inductively coupled plasma deposition (ICP), atomic layer deposition (ALD), hot wire filament (electron-based cracking) and thermal chemical vapor deposition (CVD) in a controlled-environment process system at below atmospheric pressure. Metacarborane or paracarborane, isomers of orthocarborane, as well as other hydrogenated borones and carboranes may also be used as precursors.

Following film deposition, the film and substrate are put through a thermal treatment 130, also referred to as an anneal. In one embodiment, the film is heated to a temperature between 400° C. and 505° C. in dry nitrogen as the ambient for a time between 15 and 60 minutes. Other possible ambients for the thermal treatment include, but are not limited to, <0.2 ppm $O_2$, $H_2O$ plus argon, and <$10^{-5}$ Torr vacuum. Heat treatment 130 may include increasing the temperature to a final value at a rate between 5 to 12° C./minute and decreasing the temperature from the final value at a rate of 5 to 12° C./minute.

Ohmic contacts are fabricated on the film and the substrate, step 140, allowing for electrical contact. Alternatively, ohmic contacts may be formed before the heat treatment. Ohmic contacts may be fabricated by depositing one or more thin metal films on the amorphous boron carbide film and patterning the metal films. In one example embodiment, a first metal film having a work function from about 4.3 eV to no more than 4.6 eV is deposited. A second metal film is then formed on the first metal film, the second metal film acting to prevent oxidation of the underlying first metal film. Examples of ohmic contacts that meet the above criteria include Cr/Au, Cr/Pt, Ti/Au, Cr/Ag, and Cr/Al.

Figure 2:
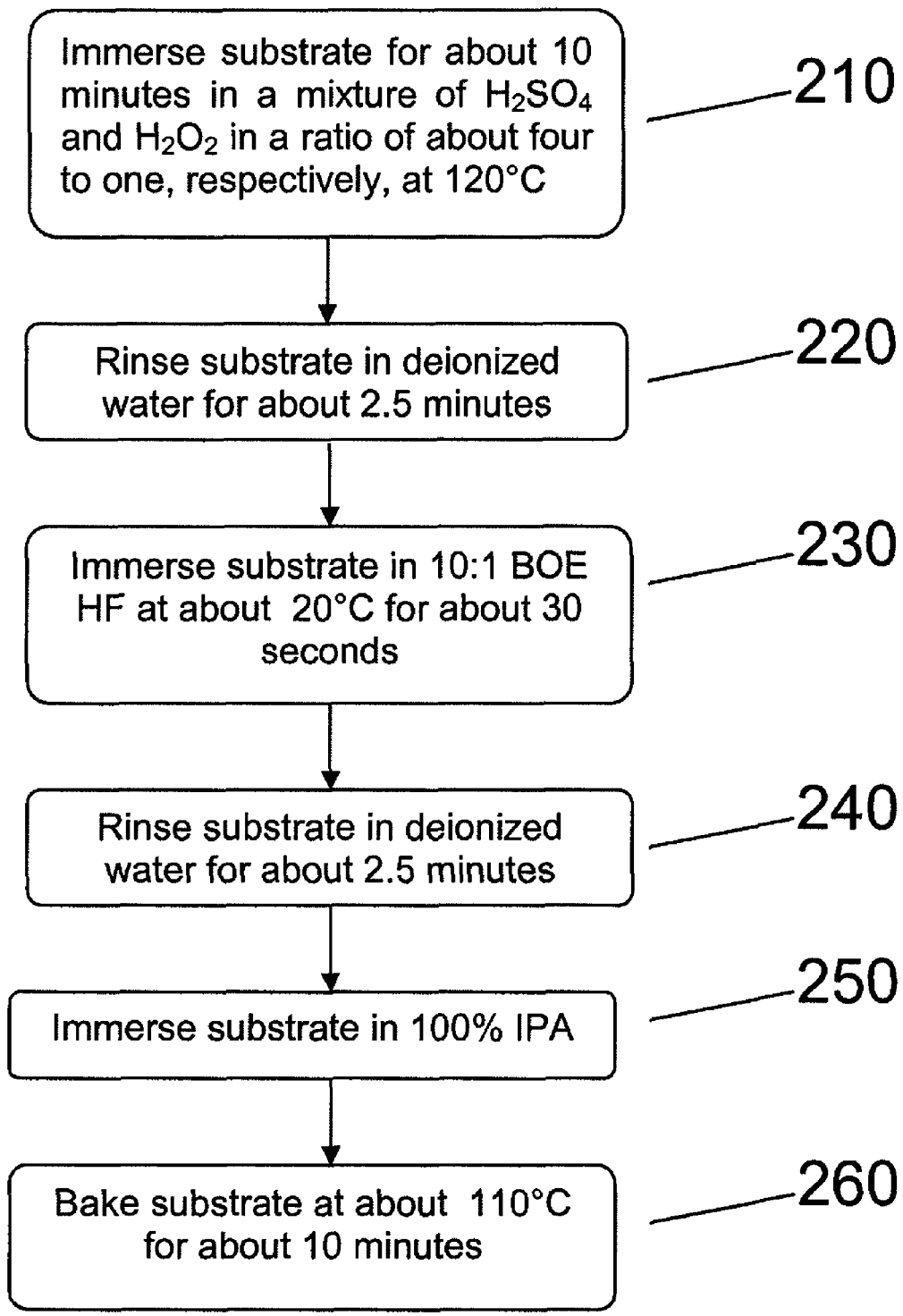
FIG. 2 is a flow diagram showing an embodiment of a substrate cleaning process.

An embodiment of a substrate cleaning procedure 110, not intended to be limiting, will now be described in greater detail with reference to FIG. 2. The materials, times, temperatures, and other variables in the following description may be varied while not affecting beneficial results of the cleaning procedure 110.

Substrates are immersed for about 10 minutes in a mixture of $H_2SO_4$ and $H_2O_2$ in a ratio of about four to one, respectively 210. The mixture may be heated to a temperature of about 120° C. Step 210 removes organic material from the substrates. Substrates are rinsed in deionized (DI) water for about 2.5 minutes 220 to remove the chemicals used in step 210 and any materials dissolved by these chemicals. Substrates are immersed in 10:1 buffered oxide etch (BOE) hydrofluoric acid at about 20° C. for about 30 seconds 230 followed by a second DI water rinse for about 2.5 minutes 240. Steps 230 and 240 remove residual oxides from the substrates and provide further chemical cleaning. Substrates are immersed in 100% isopropyl alcohol (IPA) for about 2 seconds 250. It is believed that step 250 may play a role in preventing delamination of deposited films from the substrate by leading to the formation of an interfacial layer, described in more detail below. Substrates are baked at about at about 110° C. for about 10 minutes 260 to remove any residual moisture. The bake may be performed in a conventional chemical oven in air ambient. Alternatively, a controlled inert ambient such as nitrogen or a noble gas may be used.

It has been found that when substrates are cleaned in a manner such as described, deposited boron carbide films are much less susceptible to delamination from the substrate than with other substrate cleaning methods. This may be, at least in part, attributable to a thin interface film, which may have a high carbon content, forming between the substrate and the deposited amorphous boron carbide film. High resolution transmission electron microscopy measurements suggest the presence of such an interface film having a thickness of two monolayers.

Using methods as described above, p-n junctions have been fabricated and electrically characterized. Photovoltaic measurements made on a variety of such junctions indicate that a heat treatment such as that described above, such as step 130 in FIG. 1, increases photovoltaic currents in such junctions by at least a factor of 100. A similar increase is expected for radiovoltaic currents.

Figure 3:
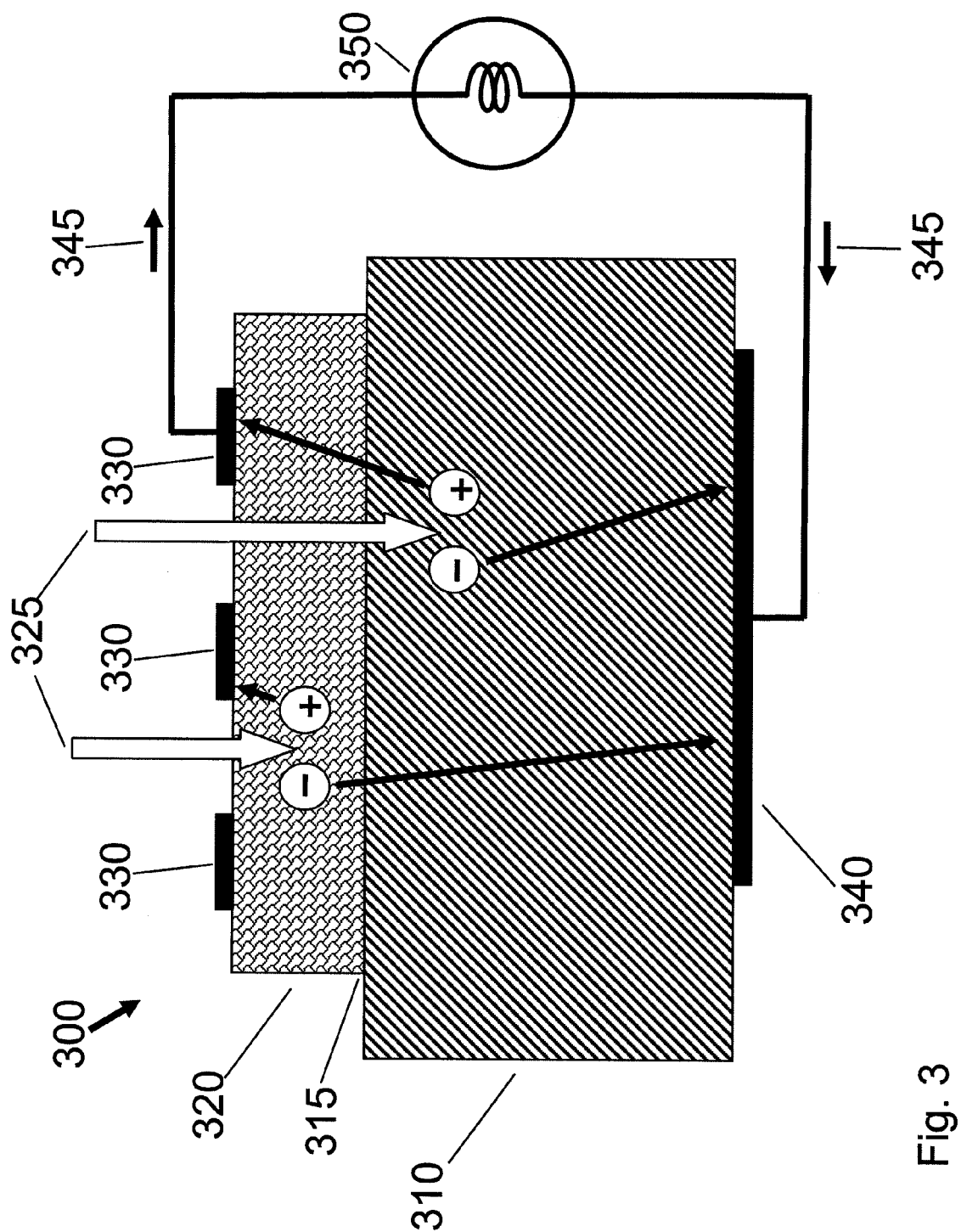
FIG. 3 shows an embodiment of a voltaic p-n junction.

FIG. 3 shows structure and operation of an embodiment of a voltaic pn-junction 300. FIG. 3 is not drawn to scale. The junction is formed at an interface 315 between a substrate 310 and a deposited amorphous boron carbide film 320. In this embodiment, deposited amorphous boron carbide film 320 is assumed to be p-type while substrate 310 is assumed to be n-type. Ohmic contacts 330 are formed on amorphous boron carbide film 320. The ohmic contacts 330 are formed with spaces in between them, or are made thin enough, or both, to allow incident radiation 325, such as photons or charged particles, to enter the structure. Ohmic contact 340 provides electrical contact to substrate 310. External load 350 is connected between ohmic contacts 330 and 340.

Incident radiation 325, such as photons or charged particles, creates electron-hole pairs (e-h pairs) within the structure. A fraction of the e-h pairs are separated by a built-in electric field within the junction, the electrons being driven toward substrate contact 340 and holes being driven toward film ohmic contacts 330. Another fraction of these separated charge carriers will reach ohmic contacts 330, 340 without recombining or being trapped. Those carriers reaching ohmic contacts 330, 340 will give rise to a current 345 through external load 350.

If no external voltage is applied across external load 350, external voltaic current 345 is referred to as the short circuit current Isc. Magnitude Isc is a measure of the overall likelihood that an e-h pair created by incident radiation 325 will contribute to a useful current through an external load 350 instead of recombining or being trapped inside the materials 310, 320 of the p-n junction. Short circuit current Isc, therefore, also provides an overall measure of the quality of amorphous boron carbide film 320 and junction 315 for a given device structure. Short circuit current Isc also provides a measure of the efficiency and capability of a junction in producing electrical power from radiation for a given device structure. Isc also provides a measure of radiation-induced degradation of electrical power generation by the junction. Short circuit current density, (defined as the short circuit current per unit device area perpendicular to the current flow), is more characteristic of the junction materials themselves, since it is largely independent of device area.

Figure 4:
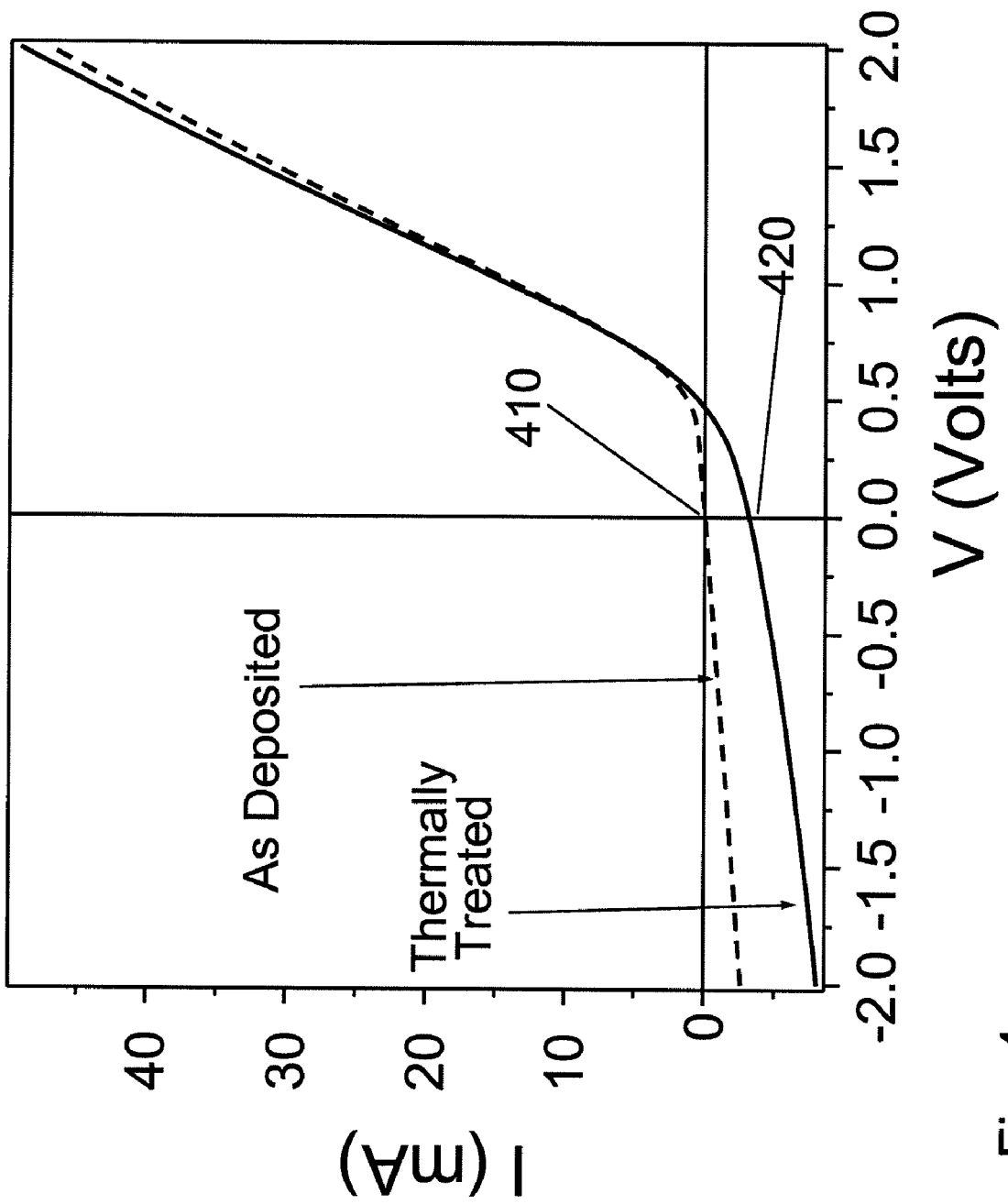
FIG. 4 shows two current vs. voltage curves for a p-n junction.

FIG. 4 shows plots of measured current 345 as a function of externally applied voltage for structures such as that shown in FIG. 3 when incident radiation 325 is photons having energies between about 1 eV and about 4 eV, corresponding to wavelengths between about 1200 nm and 310 nm, respectively. Dashed curve 410 was measured on a junction that did not undergo a heat treatment as described above in connection with step 130 of FIG. 1 and is a reflection of the prior art. Solid curve 420 was measured on the same junction but after heat treatment. Short circuit current Isc for the heat-treated and non-heat-treated films are indicated by 420 and 410, respectively, as the current at the intersection of each curve with the V=0 axis.

Short circuit current of non-heat-treated samples 410 was in the range of hundreds of microamps, which cannot be seen on the scale of FIG. 4. By contrast, as indicated in FIG. 4, heat treated samples showed short circuit currents in the range of tens of milliamps. Heat treatment, therefore, results in an increase in Isc of at least a factor of 100 for a given pn-junction structure fabricated using hydroginated boron-rich films deposited and processed as disclosed here. This increase in Isc, with implications for enhancement of the efficiency of voltaic cells fabricated using p-n junctions as disclosed herein, is an unexpected, potentially useful result.

The junctions used to obtain curves 410 and 420 were fabricated using films deposited from orthocarborane on silicon and ohmic contacts fabricated with Cr/Pt bilayer. The heat treatment employed in obtaining curve 420 was 475° C. for 60 minutes in dry nitrogen. Similar results were obtained with other substrates, other ohmic contact materials, other similar temperatures and other similar times within the ranges described above, including between 460° C. and 490° C. and between 470° C. and 480° C.

Figure 5:
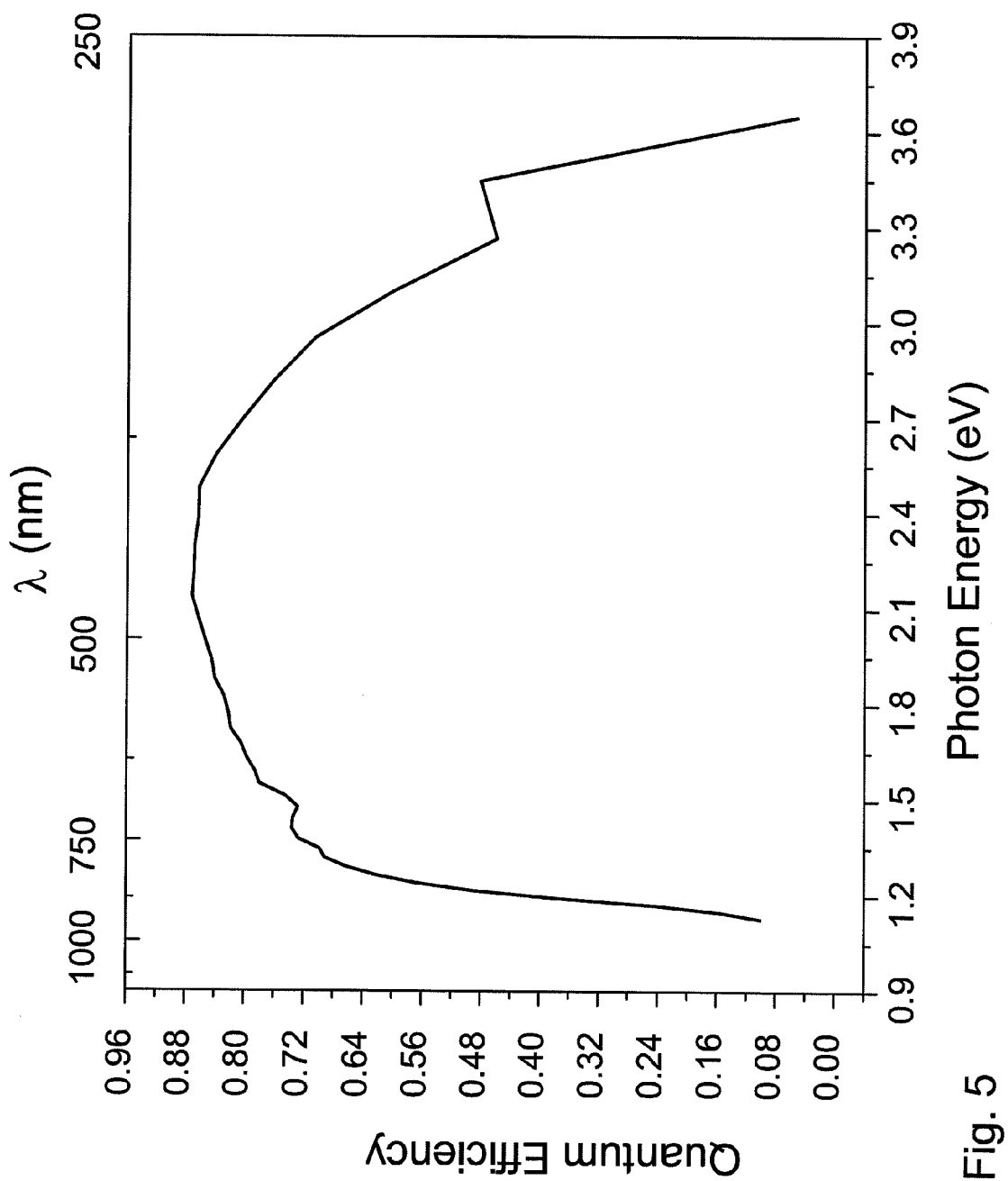
FIG. 5 shows quantum efficiency of a p-n junction as a function of photon energy for a p-n junction.

FIG. 5 shows photovoltaic quantum efficiency (QE) of a p-n junction as described above as a function of energy (or wavelength) of the incident photons. QE is defined generally as the average number of e-h pairs produced per incident photon or other particle. Increased QE of a p-n junction tends to result in increased Isc and higher overall efficiency of a voltaic cell using that p-n junction. FIG. 5 shows a QE exceeding 40% over the entirety of a photon energy range of 1.2 to 3.3 eV.

As described above, enhancement of Isc resulting from heat treatment of disclosed amorphous boron carbide films, as shown in FIG. 4, was observed in photovoltaic measurements on photovoltaic cell structures. A similar enhancement may be expected in a radiovoltaic response of a p-n junction fabricated according to the method above.

Figure 6:
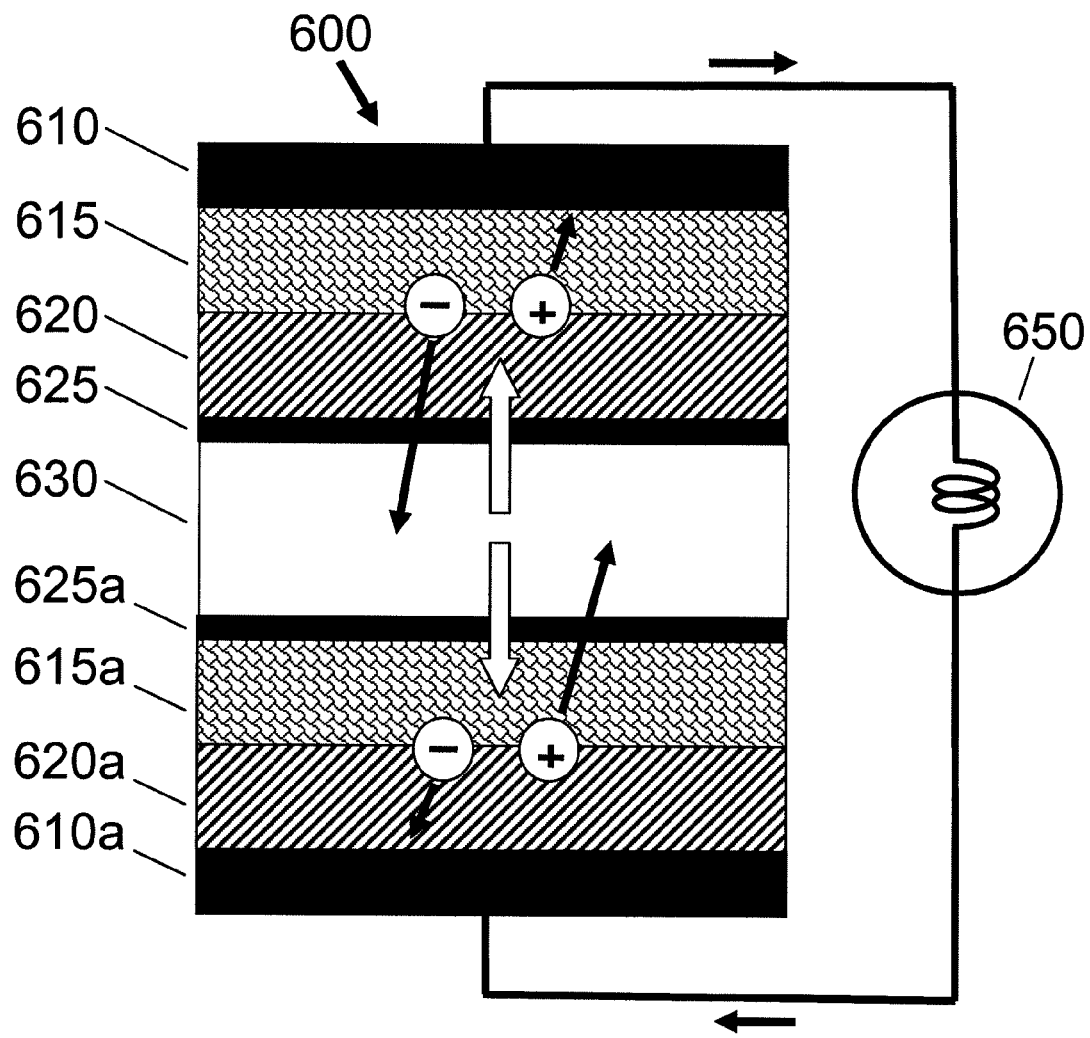
FIG. 6 shows an embodiment of a nuclear battery employing amorphous semiconductor films disclosed herein.

FIG. 6 shows an embodiment of such a radiovoltaic battery 600. Radioactive emitter 630 is situated between two p-n junctions. Radioactive emitter 630 may be a thin film including at least one emitter such as alpha emitters $^{210}$Po, $^{148}$Gd, and $^{241}$Am and beta emitters $^{63}$Ni, $^{14}$C, $^{60}$Co, $^{99}$Tc, and $^{147}$Pm. A first junction is formed by p-type material 615 and n-type material 620. A second junction is formed by p-type material 615a and n-type material 620a. The two junctions are effectively connected in series through radioactive emitter 630 by means of ohmic contacts 625 and 625a. Junction materials 615, 620, 615a and 615b may be amorphous boron carbide films fabricated as described above. Radioactive emitter 630 emits radiation such as alpha, beta, or gamma particles, into both junctions 615/620 and 615a/620a as shown by the unfilled arrows. The radiation may give rise to electron hole pairs which may then be swept out by built-in junction electric fields and give rise to an external current through a load 650. The load 650 may be electrically connected to radiovoltaic battery 600 by ohmic contacts 610 and 610a.

While the preceding description refers to certain embodiments, it should be recognized that the description is not limited to those embodiments. Rather, many modifications and variations may occur to a person of ordinary skill in the art which would not depart from the scope and spirit defined in the appended claims.

What is claimed is:

1. A p-n junction device, comprising:
a substrate of one charge carrier type; and
an amorphous semiconductor film of an opposite charge carrier type, comprising boron, carbon, and hydrogen;
wherein separated electron-hole quantum efficiency of the p-n junction exceeds 40% over the entirety of a photon energy range of 1.2 to 3.3 electron-volts.

2. The p-n junction device of claim 1, wherein the substrate is n-type and the amorphous semiconductor film is p-type.

3. The p-n junction device of claim 1, wherein the amorphous semiconductor film comprises a film deposited by plasma enhanced chemical vapor deposition (PECVD) using sublimed orthocarborane as a precursor.

4. The p-n junction device of claim 1, wherein atomic concentration of hydrogen in the amorphous semiconductor film is about 10 to about 55 atomic percent hydrogen.

5. The p-n junction device of claim 1 comprising an ohmic contact on the amorphous semiconductor film; the ohmic contact comprising:
a first metal film having a work function from about 4.3 eV to no more than 4.6 eV; and
a second metal film on the first metal, the second metal film preventing atmospheric degradation of the first metal film.

6. The p-n junction of claim 5, wherein the second metal comprises at least one of Cr/Au, Cr/Pt, Ti/Au, Cr/Ag, or Cr/Al.

7. The p-n junction device of claim 1, wherein the substrate comprises at least one of silicon, silicon carbide, a metal, or a dielectric.

8. A radiovoltaic battery comprising a p-n junction as in claim 1.

* * * * *

UNITED STATES PATENT AND TRADEMARK OFFICE
CERTIFICATE OF CORRECTION

PATENT NO. : 8,237,161 B2
APPLICATION NO. : 12/853857
DATED : August 7, 2012
INVENTOR(S) : Anthony N. Caruso et al.

It is certified that error appears in the above-identified patent and that said Letters Patent is hereby corrected as shown below:

On the Title Page, in Item (73) Assignee,

Delete "North Dakota State University" and insert therefor --NDSU--.

Signed and Sealed this
Twenty-first Day of May, 2013

Teresa Stanek Rea
*Acting Director of the United States Patent and Trademark Office*